(12) United States Patent
Marupaduga et al.

(10) Patent No.: US 8,942,755 B1
(45) Date of Patent: Jan. 27, 2015

(54) DYNAMIC GAIN ADJUSTMENT VIA MECHANICAL TRANSDUCERS INVOLVING ACTIVE COMBINERS IN WIRELESS NETWORKS

(71) Applicant: Sprint Communications Company L.P., Overland Park, KS (US)

(72) Inventors: Sreekar Marupaduga, Overland Park, KS (US); Nicholas David Caola Kullman, Kansas City, MO (US); Eugene S. Mitchell, Jr., Blue Springs, MO (US); Andrew Mark Wurtenberger, Olathe, KS (US)

(73) Assignee: Sprint Communications Company L.P., Overland Park, KS (US)

( * ) Notice: Subject to any disclaimer, the term of this patent is extended or adjusted under 35 U.S.C. 154(b) by 220 days.

(21) Appl. No.: 13/708,524

(22) Filed: Dec. 7, 2012

(51) Int. Cl.
  *H04W 52/00*  (2009.01)
  *H04W 52/52*  (2009.01)
  *H03G 3/00*  (2006.01)

(52) U.S. Cl.
  CPC ............... *H04W 52/52* (2013.01); *H03G 3/007* (2013.01)
  USPC .......................................... 455/522; 370/318

(58) Field of Classification Search
  None
  See application file for complete search history.

(56) References Cited

U.S. PATENT DOCUMENTS

| | | | | |
|---|---|---|---|---|
| 8,184,739 | B2 * | 5/2012 | Ohkawara et al. | 375/297 |
| 2002/0047745 | A1 * | 4/2002 | Kolanek | 330/149 |
| 2007/0274692 | A1 * | 11/2007 | Goto et al. | 388/800 |
| 2010/0295612 | A1 * | 11/2010 | Ohkawara et al. | 330/149 |

* cited by examiner

*Primary Examiner* — Bobbak Safaipour

(57) ABSTRACT

A method and system are provided for dynamically adjusting gain in a cell site. Network devices, such as an eNodeB, NodeB, base transceiver station, base station server, radio network controller, and base station controller can provide instructions directly or through remote radio heads to an amplification system to change the power distribution levels. The instructions are received over an AISG protocol and cause a mechanical motor in an amplification system to move a magnetic core in a solenoid causing a change in the electromagnetic field resulting in a change in an electrical current. The change in the electrical current causes a change in gain, thus, resulting in a change in the power distribution level in a cell.

20 Claims, 5 Drawing Sheets

US 8,942,755 B1

DYNAMIC GAIN ADJUSTMENT VIA MECHANICAL TRANSDUCERS INVOLVING ACTIVE COMBINERS IN WIRELESS NETWORKS

CROSS-REFERENCE TO RELATED APPLICATIONS

Not applicable.

BACKGROUND OF THE INVENTION

In the telecommunications environment, capacity needs can be an issue. For example, the number of radio output ports can be greater than the number of ports on the antenna. In such situation, a radio frequency (RF) combiner is needed. To overcome the capacity need, an operator may use an active combiner, which includes a programmable received gain. This programmable received gain is remotely adjustable and allows the operator to eliminate cable loss for the received signals and eliminate link imbalances. Unfortunately, these settings must be done at the initial setup and are thereafter static and cannot be changed. The result is that an amplifier can become degraded as the signals change over time. This ultimately leads to a degradation of the voice and data quality affecting a mobile user's experience. Therefore, a solution is needed that would allow the programmable received gain to be remotely adjustable on a dynamic basis.

SUMMARY

Embodiments of the invention are defined by the claims below, not this summary. A high-level overview of various aspects of embodiments of the invention is provided here for that reason, to provide an overview of the disclosure and to introduce a selection of concepts that are further described below in the detailed description section. This summary is not intended to identify key features or essential features of the claimed subject matter, nor is it intended to be used as an aid in isolation to determine the scope of the claimed subject matter.

Embodiments of the present invention relate generally to a method and system for incorporating dynamically adjustable analog gain into active combiners or other RF amplification systems. The dynamic gain functionality allows for efficient utilization of an amplifier as coverage and capacity needs vary to improve a user's experience. An amplification system incorporates a mechanical device to mechanically change an electrical current in the amplifier, thus, causing a change in the gain. As a result of the change in the gain, the power levels change, either increasing or decreasing as needed.

BRIEF DESCRIPTION OF THE SEVERAL VIEWS OF THE DRAWINGS

Illustrative embodiments of the present invention are described in detail below with reference to the included drawing figures, wherein.

DETAILED DESCRIPTION

Embodiments of the present invention relate generally to a method and system for incorporating dynamically adjustable analog gain into active combiners or other RF amplification systems. The dynamic gain functionality allows for efficient utilization of an amplifier as coverage and capacity needs vary to improve a user's experience. An amplification system incorporates a mechanical device to mechanically change an electrical current in the amplifier, thus, causing a change in the gain. As a result of the change in the gain, the power levels change, either increasing or decreasing as needed.

In a first aspect, a method for dynamically changing gain in a radio frequency (RF) amplification system is provided that includes receiving a gain change notification message from a controlling RF source. A motor is triggered in a power distribution circuit of an amplifier to operate based on a receipt of the gain change notification message. The amplifier is a bi-directional amplifier. With the motor, a magnetic core is moved through a solenoid in a transducer in the amplifier. A current is changed in the solenoid by a movement of the magnetic core. A power level in the transducer is changed as the current changes to increase or decrease the gain.

In another aspect, a system for adjusting gain when combining signals from radio heads is provided. Radio heads connected to an evolved node B (eNodeB) operate to provide signals to an amplification system. The amplification system operates with an active combiner and an amplifier. The active combiner operates to combine signals of the radio heads and provide an output of the combined signals. The active combiner receives an instruction from a member of the radio heads to change a gain in the amplifier. The instruction is received over an antenna interface standard group (AISG) protocol. The amplifier operates a motor that moves a magnetic core through a solenoid to change a current. A change in the current causes a change in the gain. The change in the gain increases or decreases a power level.

Figure 1A:
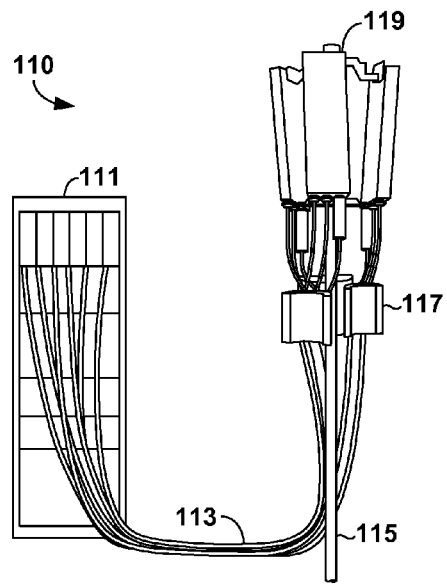
FIG. 1A is an exemplary cell site implemented in accordance with an embodiment of the present invention.

In FIG. 1A, an exemplary cell site 110 is shown with a base transceiver station (BTS) 111 connected to a cell. Cell site 110 shows a typical configuration that is found in a wireless telecommunications environment. BTS 111 connects to the cell with coaxial cables 113. It is noted that BTS 111 is an exemplary device. In other embodiments, a nodeB or an evolved node B (eNodeB) can be used in place of BTS 111. Coaxial cables 113 extend from BTS 111 to various components that are attached to a tower 115. Those components on tower 115 include amplifier 117 and antenna 119. As shown in FIG. 1A, several amplifiers, such as amplifier 117, are attached to tower 115. The amplifiers boost the signal, either towards antenna 119 or towards BTS 111. In certain configurations, amplifier 117 may be known as a masthead amplifier. Likewise, several antennas, like antenna 119, are located on tower 115 in such a configuration so as to provide a 360 degree coverage for communicating with users within the range of the cell. As one can see, the antennas are arranged in a position to provide the 360 degree coverage. Also, it is pointed out that the number of amplifiers does not have to match to the number of antennas on tower 115. For example, FIG. 1A appears to have three amplifiers 117 and four antennas 119. This configuration might indicate a mismatch in the number of ports between the devices, which is solved by an implementation of an embodiment of the present invention. In any case, wireless users or subscribers can have voice and data services by communicating between their mobile devices and the components in FIG. 1A.

Figure 1B:
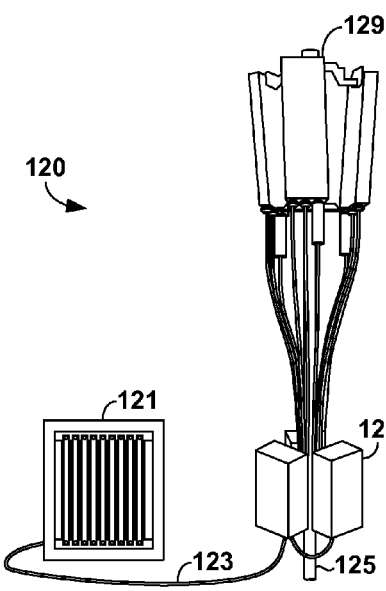
FIG. 1B is an another exemplary cell site implemented in accordance with an embodiment of the present invention.

In FIG. 1B, a cell site 120 is shown with a base station server (BSS) 121 connected to a cell. Cell site 120 shows a different configuration from cell site 110 in FIG. 1A. Cell site 120 is also found in a wireless telecommunications environment. BSS 121 connects to the cell with cable 123. In other embodiments, nodeB or evolved node B (eNodeB) can be used in place of BSS 121. Cable 123, which can be a fiber optic cable or other type of cable, extends from BSS 121 to various components that are attached to a tower 125. In this configuration, those components on tower 125 include a radio head 127 and an antenna 129. As shown in FIG. 1B, several radio heads, such as radio head 127, are attached to tower 125. The radio heads extend the range of the BTS, NodeB, eNodeB, or other similar devices. In certain configurations, radio head 127 may be known as a remote radio head and can be located as shown in FIG. 1B or located closer to antenna 129. Several antennas, like antenna 129, are located on tower 125 in such a configuration so as to provide a 360 degree coverage for communicating with users within the range of the cell. Similarly, cell site 120 functions in much the same manner as cell site 110. Also, like FIG. 1A, it is pointed out that the number of radio heads does not have to match to the number of antennas on tower 125. FIG. 1B appears to have three radio heads 127 and four antennas 129. As in FIG. 1A, this configuration might indicate a mismatch in the number of ports between devices, which may require the use of a combiner. Like FIG. 1A, wireless users or subscribers are provided voice and data services between their mobile devices and the components in FIG. 1B.

Figure 1C:
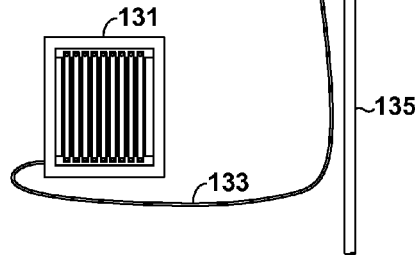
FIG. 1C is yet another exemplary cell site implemented in accordance with an embodiment of the present invention.

In FIG. 1C, a cell site 130 is shown with a base station server (BSS) 131 connected to a cell. Cell site 130 functions similar to cells sites 110 and 120. However, cell site 130 shows a different configuration with BSS 131 connecting through a cable 133 to a set of antennas 137. Antenna 137 is attached to a tower 135, which is similar to towers 115 and 125. Through the advancement of technology, antenna 137 is indicative of an active antenna while antennas 119 and 129 are indicative of passive antennas. Hence, less equipment is required between antenna 137 and BSS 131. The functionality of amplifier 117 or radio head 127 might be embedded into antenna 137.

Figure 2:
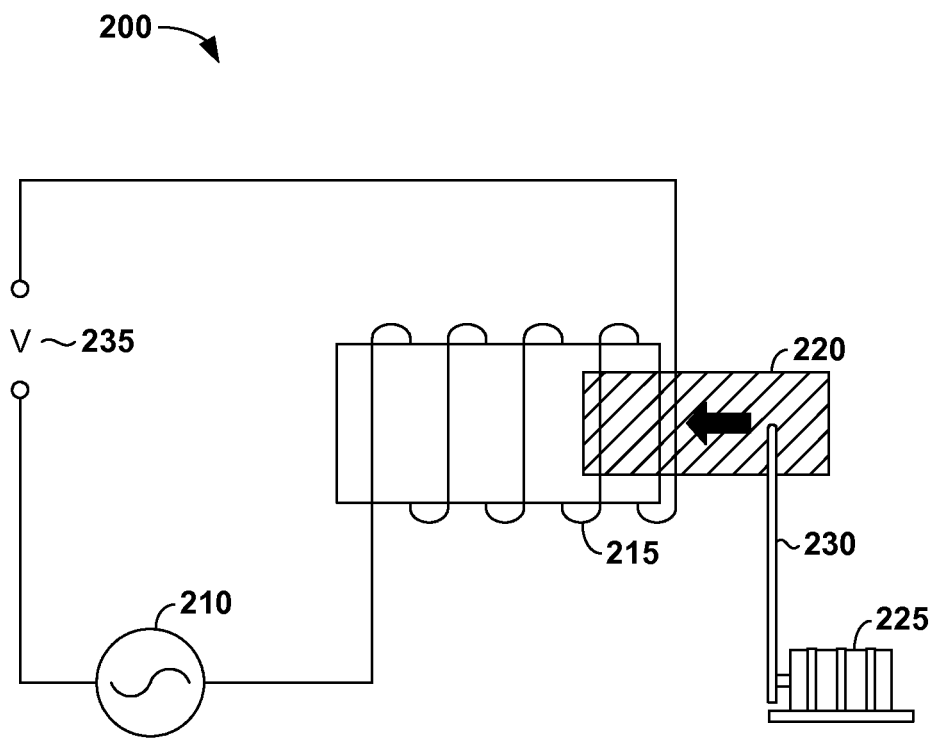
FIG. 2 is an exemplary electromagnetic solenoid circuit, implemented in accordance with an embodiment of the present invention.

Turning now to FIG. 2, an exemplary electromagnetic solenoid circuit 200 is shown with a voltage source 210 connected to a coil 215 and a volt 235. Source 210 is used to provide an initial electrical current within the electrical circuit. The electrical current travels through coil 215 and an electromagnetic field is induced. In certain embodiments, coil 215 is referred to as a solenoid because it has a wound loop of wire that is usually packed tightly into a helix. However, for the sake of simplicity and to reduce confusion, coil 215 will be used to describe the wound coils in the electrical circuit and the term solenoid circuit will be used to describe the entire circuit and the additional components, hence solenoid circuit 200.

In FIG. 2, a metallic substance 220 is used to move between coil 215. Metallic substance 220 can be iron or another substance. Also, metallic substance 220 acts as a magnetic core. This means that when electrical current passes through coil 215, a magnetic field is produced, resulting in a voltage at volt 235. Metallic substance 220 has the ability to move between coil 215. As metallic substance 220 moves between coil 215, the magnetic field changes causing a change in the electrical current. This change in electrical current causes the voltage to change in volt 235.

To facilitate a change in current, metallic substance 220 is connected to a mechanical motor 225 with arm 230. As the motor turns, arm 230 pivots causing metallic substance 220 to move inward into coil 215 or outward away from coil 215. The result is that motor 225 can be manipulated to move in a particular direction to change the position of metallic substance 220. The change of position of metallic substance 220 causes a change in the electrical current at coil 215, which results in a change in voltage that can be measured at volt 235. In the context of an embodiment of the present invention, the power gain in an amplifier can be changed mechanically by manipulating motor 225 and metallic substance 220.

Figure 3:
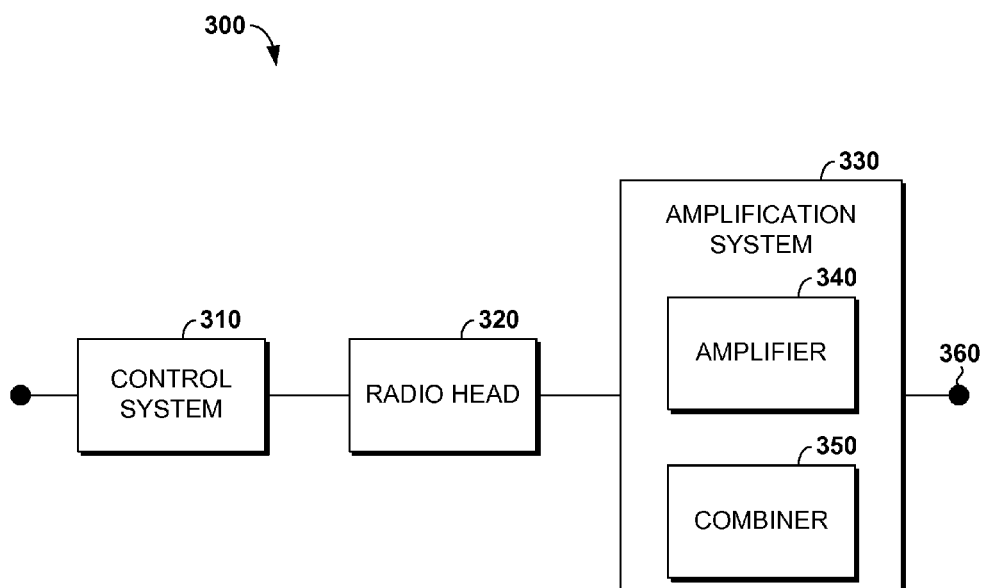
FIG. 3 is an exemplary dynamic gain adjustment system implemented in accordance with an embodiment of the present invention.

In FIG. 3, a dynamic gain adjustment system 300 is shown with a control system 310, a radio head 320, and an amplification system 330. Amplification system 330 is shown with an amplifier 340 and a combiner 350. Amplification system 330 connects to an interface 360. System 300 shows a block diagram of an implementation of an embodiment of the present invention using the components described in FIGS. 1A-1C. For example, control system 310 can represent BTS 111, BSS 121 or 131, NodeB, or eNodeB. Control system 310 can also be representative of a radio network controller or base station controller. Located remotely from control system 310 is radio head 320. Several radio heads can be located remotely near or on a cell tower.

Radio head 320 communicates with amplification system 330 to provide instructions to change the gain. The basis for the instruction can come as a result of a need to satisfy coverage and capacity needs. For example, in an embodiment, amplification system 330 includes amplifier 340 that contains electromagnetic solenoid circuit 200. When instructions are received from radio head 320 or control system 310, the gain in amplifier 340 is changed to make the adjustment so that an increase or decrease in power is provided at interface 360, which passes on to antennas such as antennas 119, 129, and 137.

Amplification system 330 also includes combiner 350. Combiner 350 can take several radio frequency (RF) input signals, combine them, and pass them along to another device or interface, such as interface 360. In one embodiment, the gain can be manipulated at amplifier 340 and then passed to combiner 350. In another embodiment, the RF signals are combined in combiner 350 and then passed to amplifier 340 where the gain is changed. In yet another embodiment, combiner 350 might not exist and only amplifier 340 is included in amplification system 330. In even yet another embodiment, amplifier 340 and combiner 350 may be combined into a single device.

Despite the various configurations that can be implemented, the present invention provides a mechanical system for dynamically adjusting the gain in a wireless telecommunication system. Amplification system 330 receives a gain change notification message over the antenna standards interface group (AISG) protocol from an eNodeB or radio head 320. The eNodeB or radio head 320 monitors cell loading conditions and average received signal levels in order to determine if an altered gain is needed. Upon receipt of the notification message, motor 225 moves the magnetic core (metallic substance 320) through coil 215 to change the electrical current. The eNodeB or radio head 320 knows how far motor 225 should move in order to achieve the desired gain. Or, the eNodeB or radio head 320 knows how far the magnetic core needs to move inside coil 215 in order to get the desired change in gain. The change in gain is used to correct link imbalances or reduce cable loss. The change in gain is also used to adjust cell coverage.

Figure 4:
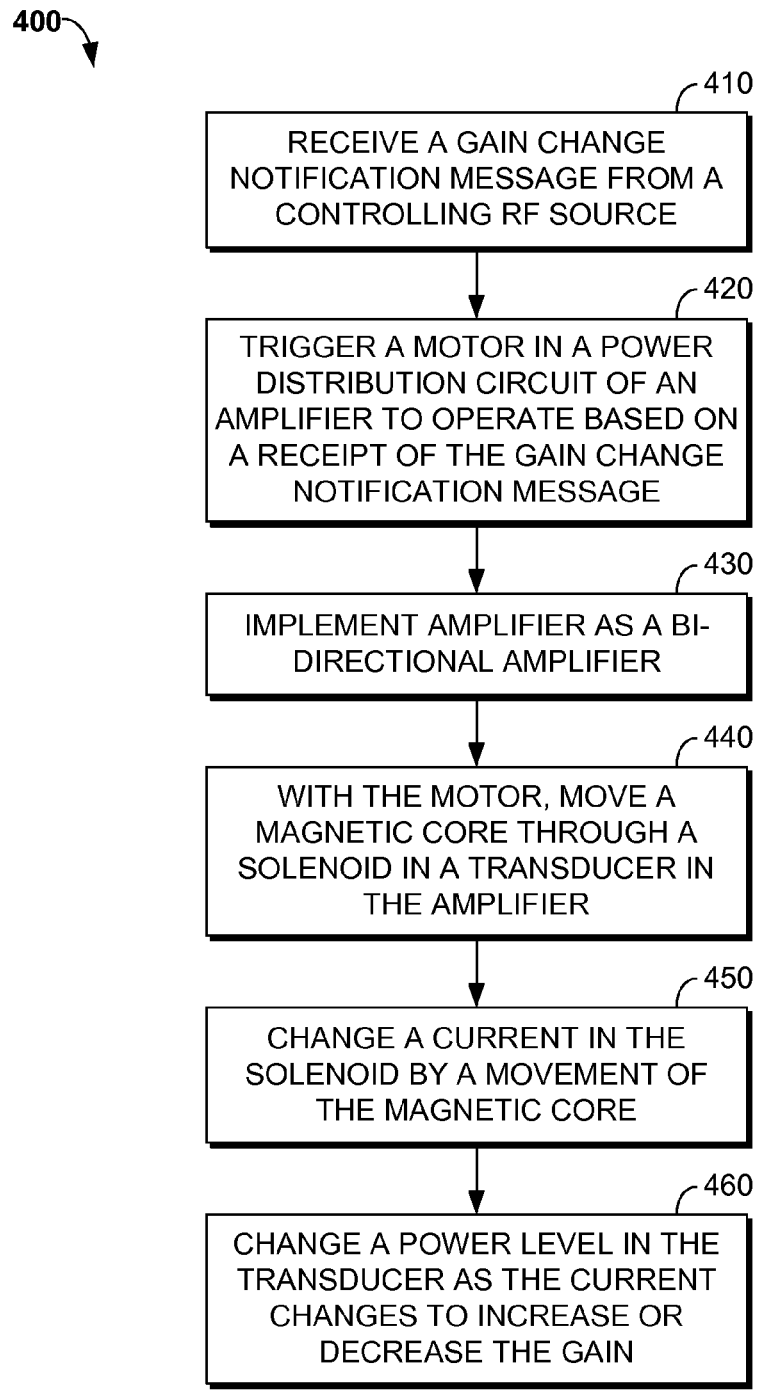
FIG. 4 is a process for dynamically changing gain in a radio frequency (RF) amplification system, implemented in accordance with an embodiment of the present invention.

Turning now to FIG. 4, a process for dynamically changing gain in a RF amplification system is provided in a method 400. In a step 410, a gain change notification message is received from a controlling RF source, such as an eNodeB, NodeB, BTS 111, BSS 121 or 131, or radio head 125 or 320. Motor 225 is triggered based on the notification message to operate. Motor 225 operates in a power distribution circuit, such as electromagnetic solenoid circuit 200, of amplifier 340, in a step 420. In a step 430, amplifier 340 can be implemented as a bi-directional amplifier. In a step 440, motor 225 moves metallic substance 220 through coil 215 in amplifier 340. An electrical current changes in coil 215 due to the change in the electromagnetic field caused by the movement of metallic substance 220 (magnetic core), in a step 450. In a step 460, a power level, which can be measured at volt 235 or interface 360, is changed in amplification system 330 as the electrical current changes. The change in power level is influenced by an increase or decrease in gain.

Figure 5:
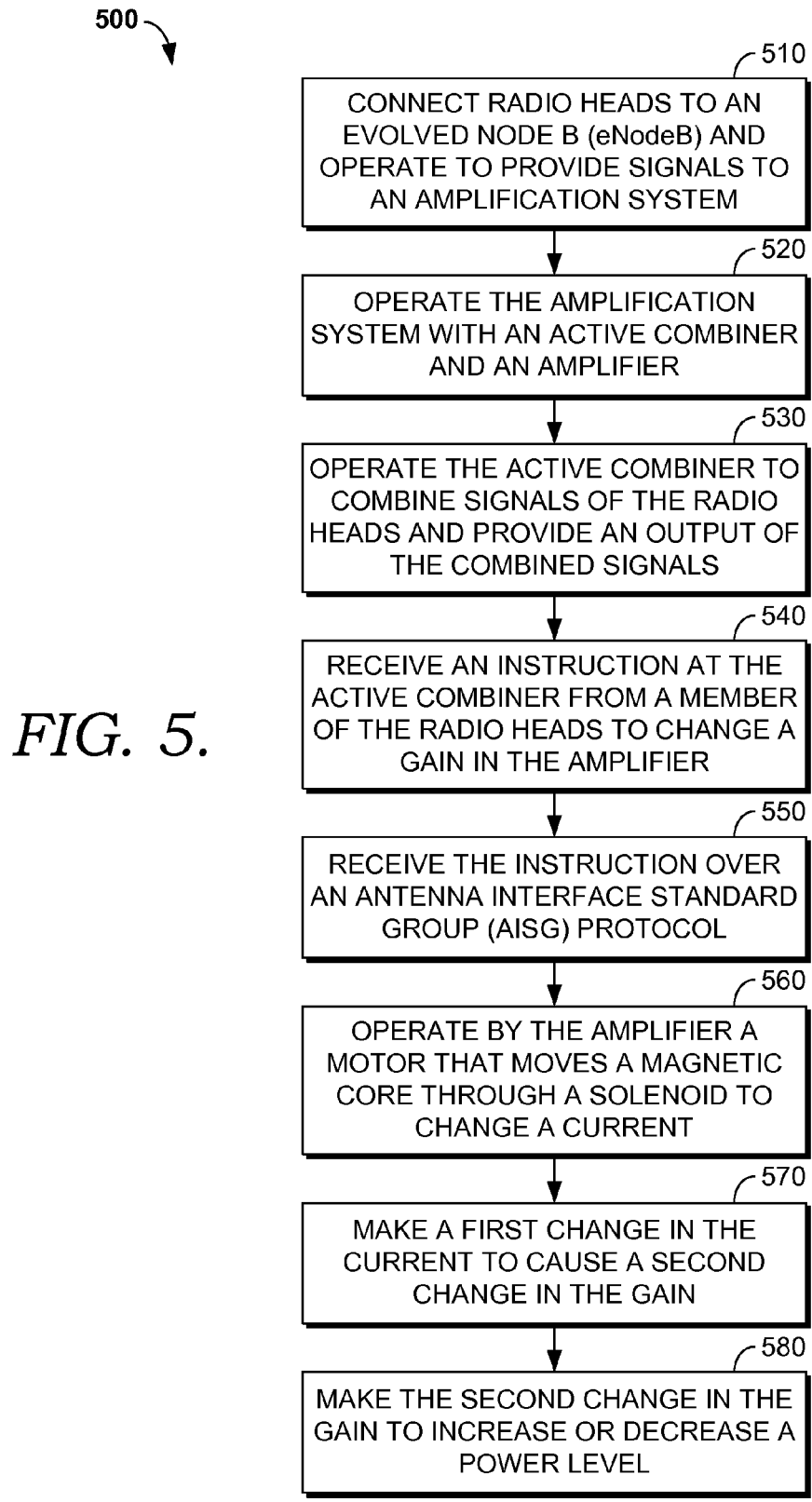
FIG. 5 is a process for adjusting gain when combining signals from radio heads, implemented in accordance with an embodiment of the present invention.

In FIG. 5, a process for adjusting gain when combining signals from radio head 127 or 320 is provided in a method 500. In a step 510, radio heads in the form of radio head 127 or 320 connect to an eNodeB. In other embodiments, the radio heads can connect to a NodeB, BTS 111, BSS 121 or 131, radio network controller, or base station controller. The radio heads operate to provide RF signals to amplification system 330. In a step 520, amplification system 330 operates with active combiner 350 and amplifier 117 or 340. In other embodiments, amplification system 330 may operate with amplifiers alone without the combiner. In another embodiment, amplification system may include a single device that has the functionality of combiner 350 and amplifier 117 or 340.

In a step 530, active combiner 350 operates to combine RF signals of radio head 127 or 320, and provides an output of the combined signals that may be delivered to amplifier 340 or delivered directly to interface 360 to go to antenna 119, 129, or 137. In a step 540, an instruction is received from radio head 320 or control system 310 at active combiner 350 to change a gain in amplifier 340. The instruction is received over an AISG protocol, in a step 550. Amplifier 340 operates motor 225 based on the instruction to move a magnetic core (metallic substance 220) through a solenoid (coil 215) to change a current in solenoid circuit 200, in a step 560. In a step 570, the change in the electrical current causes a change in the gain that can be measured at volt 235. In a step 580, the change in the gain corresponds to a increase or decrease in a power level for the cell in cell site 110, 120, or 130.

In an implementation of an embodiment of the present invention, an exemplary illustration is provided as follows. In many circumstances, cell sites are deployed fixed assets that are not easily changeable. Capacity needs may grow quickly, but the ability to change equipment may not be possible. For example, a cell site may have an amplifier with eight (8) ports but only an antenna with four (4) ports. Ordinarily, the ideal situation might be to increase the number of ports by adding another antenna so that there are equally 8 ports at the amplifier and 8 ports total at the antennas. However, under such circumstances, it may be impossible to change the amplifier or the antenna. With the present invention, a combiner can be used to combine the signals and output them to the antenna. Further, the RF signals can be changed dynamically based on instructions received from the eNodeB or remote radio heads. The eNodeB or remote radio heads can send instructions to the amplifier and combiner to adjust the gain. Either the RF signals are increased or decreased depending on the circumstances detected by the eNodeB or remote radio heads. More particularly, the eNodeB or remote radio heads can issue instructions to handle more users in a cell sector, to reduce cable loss, to correct link imbalances, or to increase or reduce wireless coverage of a sector.

Many different arrangements of the various components depicted, as well as components not shown, are possible without departing from the spirit and scope of embodiments of the present invention. Embodiments of the present invention have been described with the intent to be illustrative rather than restrictive. Certain features and subcombinations are of utility and may be employed without reference to other features and subcombinations and are contemplated to be within the scope of the claims.

The invention claimed is:

1. A method for dynamically changing gain in a radio frequency (RF) amplification system, comprising:
   receiving a gain change notification message from a controlling RF source;
   triggering a motor in a power distribution circuit of an amplifier to operate based on a receipt of the gain change notification message, wherein the amplifier is a bi-directional amplifier;
   with the motor, moving a magnetic core through a solenoid in a transducer in the amplifier;
   changing a current in the solenoid by a movement of the magnetic core; and
   changing a power level in the transducer as the current changes to increase or decrease the gain.

2. The method of claim 1, wherein receiving the gain change notification message comprises receiving the gain change notification message over an antenna interface standards group (AISG) communication protocol.

3. The method of claim 2, further comprising monitoring a cell loading condition and average received signal levels by the RF source.

4. The method of claim 3, wherein the controlling RF source is a radio head.

5. The method of claim 3, wherein the controlling RF source is an evolved node B (eNodeB).

6. The method of claim 3, wherein receiving the gain change notification message comprises receiving the gain change notification message when a cable loss of a received signal is detected.

7. The method of claim 3, wherein receiving the gain change notification message comprises receiving the gain change notification message when a link imbalance is detected.

8. A system for adjusting gain when combining signals from radio heads, comprising:
   two or more radio heads connected to an evolved node B (eNodeB) operate to provide signals to an amplification system;
   the amplification system operates with an active combiner and an amplifier;
   the active combiner operates to combine signals of the two or more radio heads and provide an output of the combined signals;
   the active combiner receives an instruction from a member of the two or more radio heads to change a gain in the amplifier, wherein the instruction is received over an antenna interface standard group (AISG) protocol; and
   the amplifier operates a motor that moves a magnetic core through a solenoid to change a current, wherein a first change in the current causes a second change in the gain, wherein the second change increases or decreases a power level.

9. The system of claim 8, further comprising the output is provided to an antenna.

10. The system of claim 9, wherein the active combiner and the amplifier are connected together.

11. The system of claim 9, wherein the amplifier is located within the active combiner.

12. The system of claim 9, wherein the active combiner receives the instruction when a cable loss of a received signal is detected.

13. The system of claim 9, wherein the active combiner receives the instruction when a link imbalance is detected.

14. A system for dynamically changing gain, comprising:
a radio frequency (RF) amplification system receives a gain change notification message from a controlling RF source;
a motor in a power distribution circuit of an amplifier in the RF amplification system operates on a receipt of the gain change notification message, wherein the amplifier is a bi-directional amplifier;
the motor moves a magnetic core through a solenoid in a transducer in the amplifier;
a movement of the magnetic core changes a current in the solenoid; and
a power level in the transducer changes to increase or decrease the gain.

15. The system of claim 14, wherein the RF amplification system receives the gain change notification message over an antenna interface standards group (AISG) communication protocol.

16. The system of claim 15, further comprising the RF source monitors a cell loading condition and average received signal levels.

17. The system of claim 16, wherein the controlling RF source is a radio head.

18. The system of claim 16, wherein the controlling RF source is an evolved node B (eNodeB).

19. The method of claim 16, wherein the RF amplification system receives the gain change notification message when a cable loss of a received signal is detected.

20. The method of claim 16, wherein the RF amplification system receives the gain change notification message when a link imbalance is detected.

* * * * *